(12) United States Patent
Yang et al.

(10) Patent No.: US 7,573,343 B2
(45) Date of Patent: Aug. 11, 2009

(54) RTD-HBT DIFFERENTIAL OSCILLATOR TOPOLOGY

(75) Inventors: Kyoung-Hoon Yang, Daejeon (KR); Sun-Kyu Choi, Sungnam-shi (KR); Yongsik Jeong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 53 days.

(21) Appl. No.: 11/463,669

(22) Filed: Aug. 10, 2006

(65) Prior Publication Data
US 2008/0042762 A1 Feb. 21, 2008

(30) Foreign Application Priority Data
Aug. 4, 2006 (KR) .................. 10-2006-0073845

(51) Int. Cl.
*H03B 7/14* (2006.01)
*H03K 3/315* (2006.01)
(52) U.S. Cl. ............... 331/107 T; 331/167; 331/117 R; 331/177 V
(58) Field of Classification Search ............... 331/36 C, 331/117 R, 117 FE, 108 C, 107 G, 107 T 331/132, 167, 177 R, 177 V
See application file for complete search history.

(56) References Cited

U.S. PATENT DOCUMENTS

| | | | | | |
|---|---|---|---|---|---|
| 3,701,051 | A | * | 10/1972 | Simms ..................... | 331/107 T |
| 5,708,398 | A | * | 1/1998 | Shen et al. ................. | 331/115 |
| 5,883,549 | A | * | 3/1999 | De Los Santos ......... | 331/107 T |
| 5,942,952 | A | * | 8/1999 | Nair et al. .................. | 331/115 |

OTHER PUBLICATIONS

Camprini et al., "Ultra Low DC Power Consumption In-P HITFET Based Differential Oscillator", Electrotechnical Conference 2004, MELECON 2004: Proceedings of the 12th IEEE Mediterranean, vol. 1, May 12-15, 2004, pp. 171-174.*

Kesan et al., "Microwave and Millimeter-Wave QWITT diode oscillators," IEEE Transactions on Microwave Theory and Techniques, vol. 37, No. 12, pp. 1933-1941, Dec. 1989.

Reddy et al., "Bias Stabilization for Resonant Tunnel Diode Oscillators," IEEE Microwave and Guided Wave Letters, vol. 5, No. 7, pp. 219-221, Jul. 1995.

Cidronali et al., "Ultralow DC Power VCO Based on InP-HEMT and Heterojunction Interband Tunnel Diode for Wireless Applications," IEEE Transactions on Microwave Theory and Techniques, vol. 50, No. 12, pp. 2938-2946, Dec. 2002.

Choi et al., "5-GHz VCO with a Wide Tuning Range Using an InP-Based RTD/HBT Technology," the 12th European Gallium Arsenide and Other Compound Semiconductors Application Symposium, Amsterdam, Netherlands, Oct. 11-12, 2004, pp. 207-210.

Jeong et al., "Performance Improvement of InP-Based Differential HBT VCO Using the Resonant Tunneling Diode," Conference Proceedings of the 2006 International Conference on Indium Phosphide & Related Materials, May 7-11, 2006, Princeton University, Princeton, New Jersey, pp. 42-45.

* cited by examiner

*Primary Examiner*—Robert Pascal
*Assistant Examiner*—Ryan J. Johnson
(74) *Attorney, Agent, or Firm*—Greenblum & Bernstein, P.L.C.

(57) ABSTRACT

The new RTD-HBT differential oscillator circuit topology is proposed. At the nodes of the inductors and varactors in the conventional differential oscillator topology, each RTD is attached to increase the magnitude of the negative conductance, which results in performance improvement in both the RF output power and phase noise. And, the differential sinusoidal voltage waveform which is essential for the wireless communication system are generated. In addition, the DC power consumption RTD-HBT differential oscillator circuit is similar to the conventional HBT differential oscillator due to the small DC power consumption performance of the RTD.

8 Claims, 9 Drawing Sheets

RTD-HBT DIFFERENTIAL OSCILLATOR TOPOLOGY

BACKGROUND OF THE INVENTION

1. Field of the Invention

The present invention relates to Microwave/mm-wave band MMIC oscillator. More specifically, the present invention relates to the method to a high RF power and differential RTD-HBT oscillator which is a key element for wireless communication systems.

2. Description of the Related Art

Recently, the demand of the microwave and millimeter-wave wireless communication systems including the application areas of satellite communication, wireless LAN and local multipoint distribution services (LMDS) has been greatly increased. In these systems, a voltage controlled oscillator (VCO) is a crucial circuit block, which is used as a local oscillator or up and down converters. For the VCOs, one of the important performance requirements is low power consumption.

In order to achieve the microwave signal generation at low power, the development of the negative cell, which operates at low bias voltage and current, is essential. The conventional negative resistance cell for microwave and millimeter-wave VCOs is comprised of the conventional 3-terminal devices, such as heterojunction bipolar transistors (HBTS) or high electron mobility transistors (HEMTs), or the conventional 2-terminal devices, such as the Gunn or IMPATT diode. However, the negative resistance cell based on the conventional devices usually requires high bias voltage and high bias current for operating at microwave and millimeter-wave ranges. Therefore, as an alternative approach, a tunneling diode (TD), which is one of the most matured quantum devices, has attracted a great deal of interests for the low-power microwave and millimeter-wave VCO due to the high current density and the unique 10 negative differential resistance (NDR) characteristics which arise at a low applied voltage range from the quantum transport phenomena at room temperature. FIG. 1 shows an DC I-V curve of the tunneling diode, As shown in the FIG. 1, the negative differential resistance is generated at the forward applied bias voltage. In particular, the InP based resonant tunneling diode (RTD) shows a negative differential resistance in the low applied bias voltage about below 0.5 V, and shows an high cutoff frequency. In previous works, several tunneling diode oscillators have been demonstrated especially for their advantages of high-frequency and low power consumption. (Ref: (1) V. P. Kesan, A. Mortazawi, D. R. Miller, V. K. Reddy, D. P. Neikirk, and T. Itoh, "Microwave and millimeter-wave QWITT diode oscillators," IEEE Trans. Microwave Theory Tech., vol. 37, no. 12, pp. 1933-1941, Dec. 1989. (2) M. Reddy, R. Y. Yu, H. Kroemer, M. J. W. Rodwell, S. C. Martin, R. E. Muller, and R. P. Smith, "Bias stabilization for resonant tunnel diode oscillators," IEEE Microwave Wireless Comp. Lett., vol. 5, no. 7, pp. 219-221, July, 1995.)

Moreover, in order to improve the performance of the oscillators, the MMIC oscillators which are implemented on the stacked-layer structure, have been reported, where the varactor, the 3-terminal devices and the tunneling diode are monolithically integrated. (Ref (3) A. Cidronali, G. Collodi, M. Camprini, V. Nair, G. Manes, J. Lewis, and H. Goronkin, "Ultralow DC power VCO based in InP-HEMT and heterojunction interband tunnel diode for wireless applications," IEEE Trans. Microwave Theory Tech., vol. 50, no. 12, pp. 2938-2946, Dec. 2002. (4) S. Choi, B. Lee, T. Kim, and K. Yang, "5-GHz VCO with a wide tuning range using an InP-based RTDIHBT technology," the 12th European Gallium Arsenide and Other Compound Semiconductors Application Symp., Amsterdam, Netherlands, Oct. 11-12, 2004, pp. 207-210)

The stacked-layer heterostructure design implementing the VCO provides the following advantages. First, by integrating the varactor which has a large capacitance ratio, the VCO with a wide tuning range can be easily implemented. Second, the transistor-amplifier output buffer for isolating the output load from the VCO core can be monolithically integrated with the VCO core to prevent the loss of the RF power. Third, the conventional 3-terminal based ICs, such as HBT ICs or HEMT ICs, can be monolithically integrated with the tunneling diode VCOs. Hence, the wireless communication systems, which are composed of VCOs, flip-flops, and amplifiers, can be also monolithically implemented based on the TD-based IC technologies. However, the developed TD based VCOs have several problems; First, they can not generate the differential sine wave signal which is essential for circuit block in the wireless communication system such as a frequency synthesizer. Second, the RF power generating from the TD based VCO is small for the wireless communication system. The narrow Negative Differential Resistance Region of the Tunnel Diode reduces the RF power.

SUMMARY OF THE INVENTION

In view of the above problems, the present invention provides a differential and enhanced RF power oscillator circuit suitable for wireless communication system. In this invention, the InP based resonant tunneling Diode (RTD) is represented for the Tunnel Diode (TD). The RTD shows the high cutoff frequency, low DC power consumption and room temperature operation. And the Heterojunction bipolar transistor (HBT) represented for the BJT.

The new RTD-HBT differential oscillator circuit topology is proposed. At the nodes of the inductors and varactors in the conventional differential oscillator topology, each the RTD is attached to increase the magnitude of the negative conductance, which results in performance improvement in both the RF output power and phase noise. And the differential sinusoidal waveforms are generated at each output terminal. In addition, the DC power consumption RTD-HBT differential oscillator circuit is similar to the conventional HBT differential oscillator due to the small DC power consumption performance of the RTD.

DETAILED DESCRIPTION OF THE EMBODIMENTS

Figure 2:
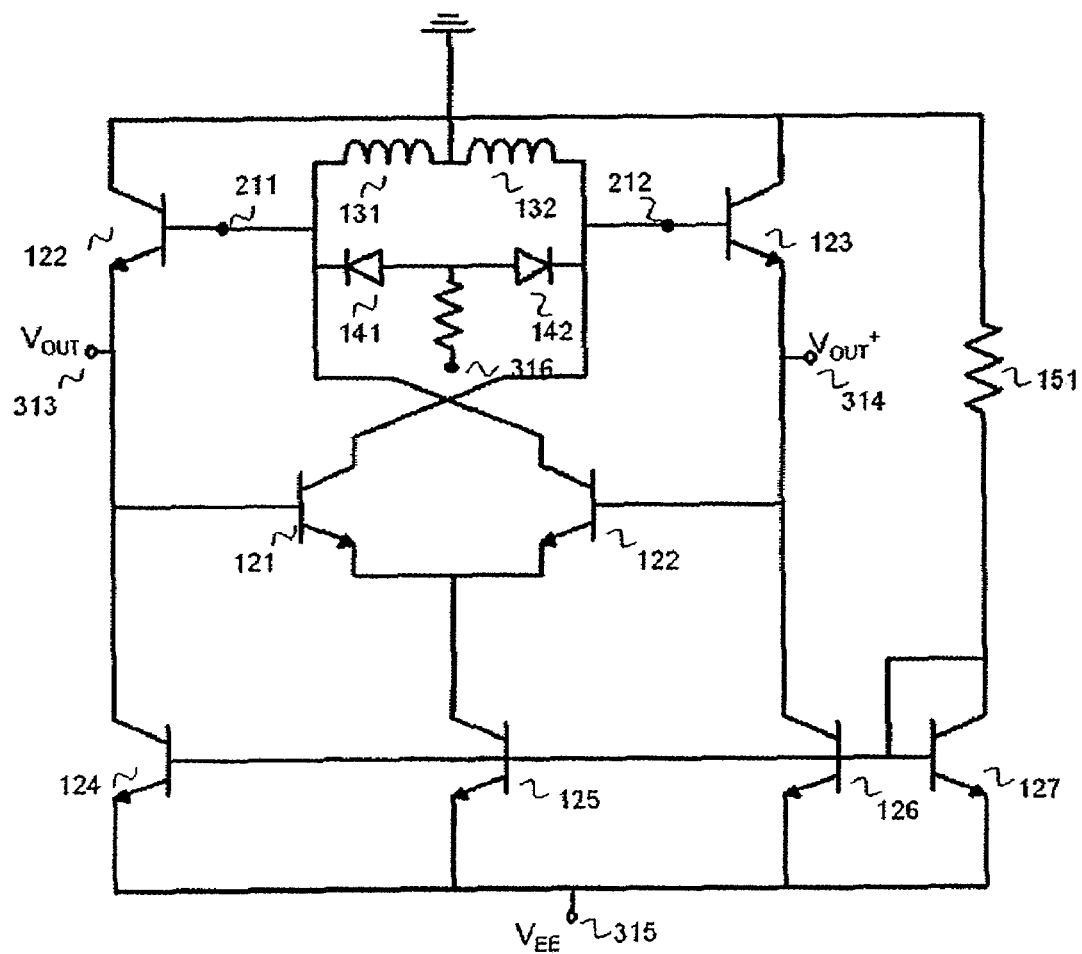
FIG. 2 is a schematic diagram of the conventional cross coupled differential oscillator.

The present invention describes a differential and high RF power HBT/RTD oscillator circuit topology which is suitable for wireless communication system. FIG. 2. shows the conventional differential cross-coupled VCO topology by using the HBT. As shown in FIG. 2, the collector port of the HBT (121) is connected to the base of the HBT (123) which is operated as the buffer, and the emitter of the HBT (123) is connected to the base of the HBT (120). The collector port of the HBT (120) is connected to the base of the HBT (122) which is operated as the buffer, and the emitter of the HBT (122) is connected to the base of the HBT (121). In this cross-coupled topology, the negative conductance or negative resistance are shown in the node 211 and node 212. And the current mirror is consisted of the HBTs 124, 125, 126, and 127. The current mirror provides the current for the cross-coupled oscillator core.

The negative supply voltage is applied at the node 315. The oscillation frequency is determined by the inductor (131,132) and the Varactor (141,142). And by varying the control voltage of the varactor at the node 316, the oscillation frequency can be varied. In this conventional differential cross-coupled oscillator topology, the differential sinusoidal voltage waveform can be obtained at the output node 313 and 314. The differential VCO topology has the advantage of low phase noise due to insensitivity to the common-mode noise. In the conventional differential cross-coupled HBT VCO, the total negative conductance is $-g_m/2$ which compensates the loss of the resonator and output buffer for oscillation.

Figure 3:
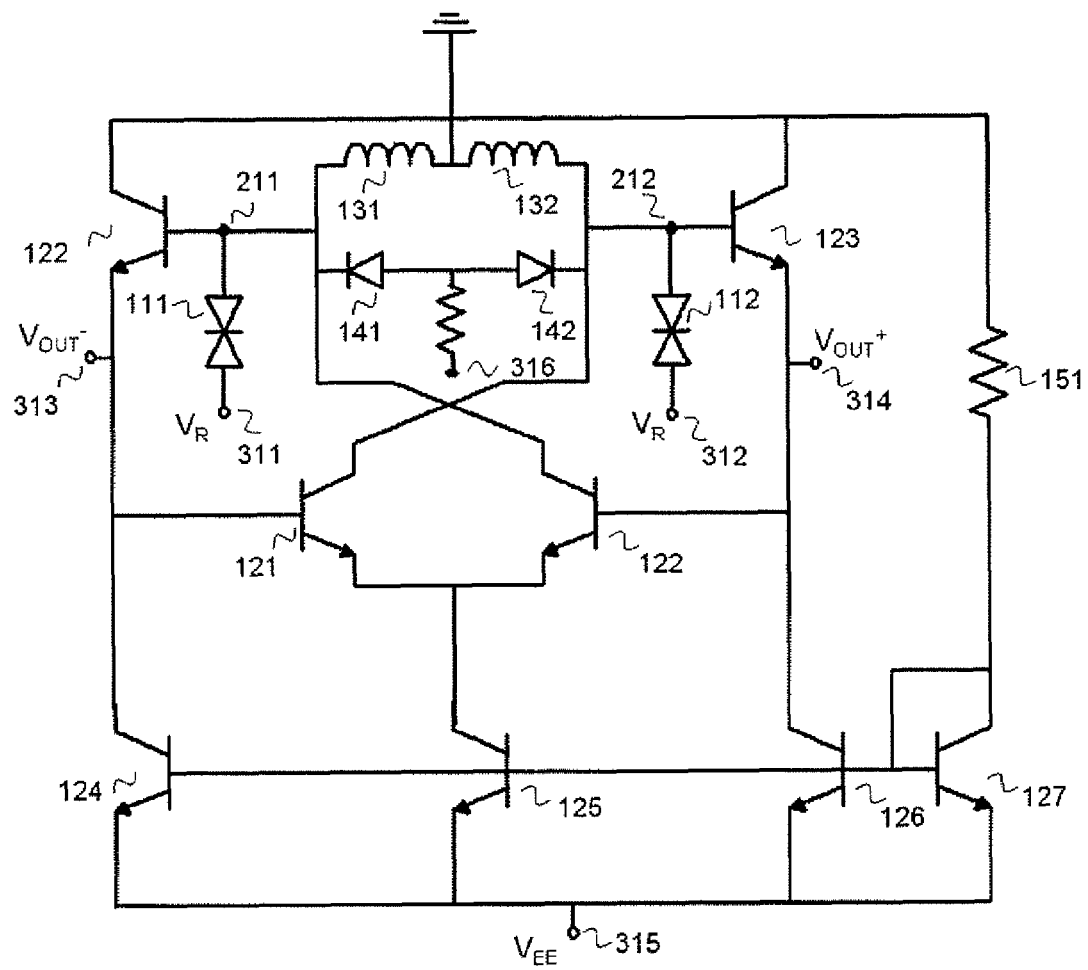
FIG. 3 is a schematic diagram of a preferred embodiment of a HBTI/RTD differential oscillator circuit in accordance with the present invention.

FIG. 3 shows the schematic diagram of the RTD/HBT differential oscillator topology which is constructed by present invention. The present invention is applied to the conventional oscillator topology which is described by the FIG. 2. This invention can apply to all 3-terminal based technology. In this invention, we select the HBT for the example. The HBT has several advantages, such as high cutoff frequency and the Low 1/f noise performance. As shown in FIG. 3, the RTD, which generated the negative conductance (resistance), are connected the node 211, 212 at which the negative resistance by the cross-coupled HBT core is shown.

Figure 1:
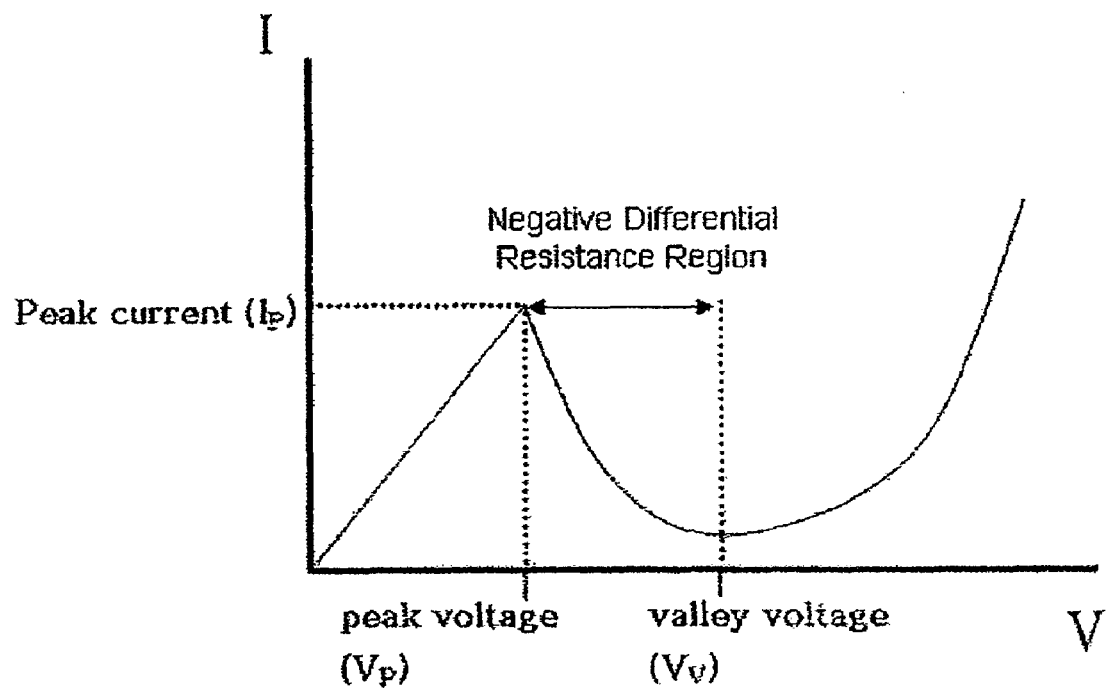
FIG. 1 is a drawing of DC I-V curve of the tunneling Diode.

The emitter of the RTD (111) is connected to the collector of the HBT (120) and the emitter of the RTD (112) is connected to the collector of the HBT (121). And at the collector of the RTD (311,312), the bias voltage is applied. The magnitude of the bias voltage of the RTD (311,312) is set to be more than the peak voltage ($V_P$) and less than the valley voltage ($V_V$) in FIG. 1. In the case of the RTD, the bias voltage is below 0.5 V, which is sufficient small for low DC power consumption. In this invention, the negative conductance which is shown at the node 211 and 212 is equal to:

$$G_{tot} = -g_m/2 - G_{RTD}/2$$

($G_m$: conductance of the HBT (120,121), $G_{RTD}$: Negative Conductance of the RTD (111,112))

In this present invention, the total negative conductance is increased than the RTD based oscillator topology due to the additional negative conductance generated by the cross-coupled HBT core. The increased negative conductance enhances the RF power than the RTD based oscillator. And the enhanced RF power also results for the improvement of the phase noise performance. The oscillation is initiated and maintained by the negative conductance generated in the circuit, and the oscillation frequency is determined by the resonator which consisted of the inductors (131,132) and the varactors (141,142). The role of buffer is to isolate the oscillation core and the load for measurement. The differential sinusoidal voltage waveform can be obtained at the output node 313 and 314 in this invention. In present invention, the Resonant Tunneling Diode (RTD) can be replaced by the Tunneling Diode (RTD), and the HBT can be replaced by the other 3-terminal devices, such as BJT, FET and HEMT.

The detail of the RTD epitaxial profile is shown in Table 1. The AlAs, which bandgap energy is relatively larger, forms the barrier, and the InGaAs, which band gap energy is relatively smaller, forms the well. In order to achieve a low peak voltage of the RTD for the low DC power consumption of the VCO, the InAs subwell layers are used.

TABLE 1

The RTD layer structure

| Device | Material | Thick. | Doping (cm$^{-3}$) |
|---|---|---|---|
| RTD | InGaAs | 500 Å | $1 \times 10^{19}$ |
| | InGaAs | 200 Å | $1 \times 10^{18}$ |
| | InGaAs | 15 Å | undoped |
| | AlAs | 19 Å | undoped |
| | InGaAs | 10 Å | undoped |
| | InAs | 21 Å | undoped |
| | InGaAs | 10 Å | undoped |
| | AlAs | 19 Å | undoped |
| | InGaAs | 15 Å | undoped |
| | InGaAs | 200 Å | $1 \times 10^{18}$ |
| | InP | 50 Å | $1 \times 10^{19}$ |
| | InGaAs | 1500 Å | $1 \times 10^{19}$ |
| | InP | 100 Å | $>2 \times 10^{19}$ |

Figure 4:
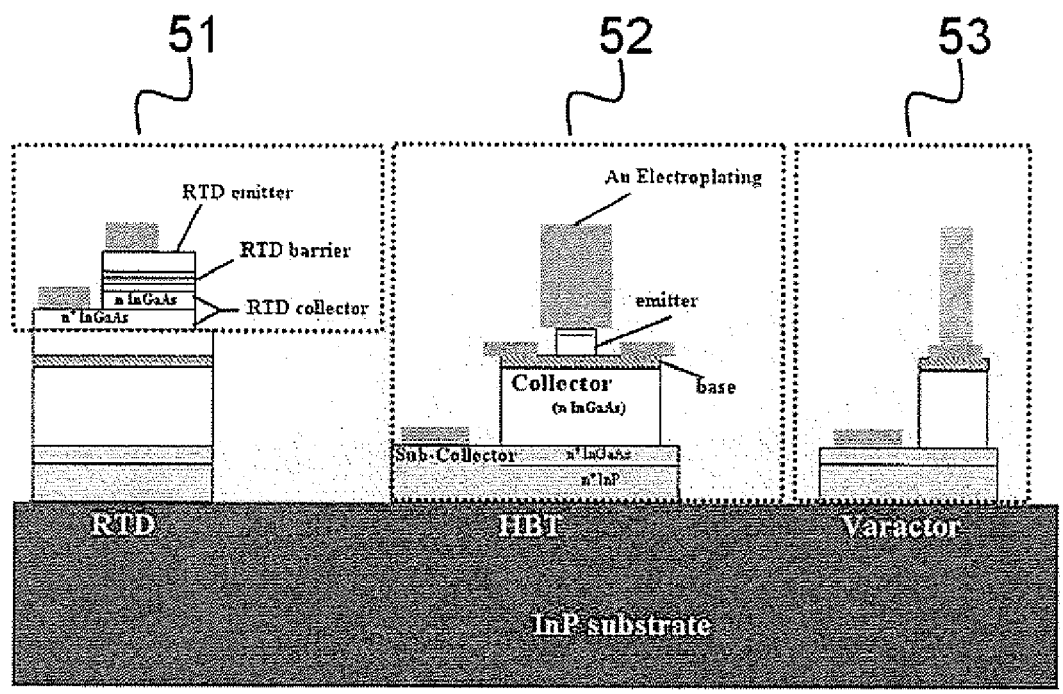
FIG. 4 is a drawing of a RTD/HBT epi-layer in which the RTD, HBT, Varactor is integrated.

The stacked-layer RTD/HBT heterostructure grown on an InP substrate is used in this invention as shown in FIG. 4. The conventional InP/InGaAs single HBT layers and the InP-based pseudomorphic RTD layers were sequentially grown on the semi-insulating InP substrate by a molecular beam epitaxy (MBE) system. The RTD/HBT MMIC VCOs have been fabricated in process sequence of RTD, HBT/varactor, thin-film resistor, and passivation layer deposition, and interconnect lines by using the optical lithography and wet chemical etching techniques. The fabrication starts with the evaporation of RTD emitter metals. After RTD emitter mesa formation, RTD collector metals were evaporated on highly doped RTD subcollector layers. Then, HBT devices were established based on the method of self-alignment for the base metals. Varactor devices were easily formed using the shared base-collector p-n junction of the HBT These active devices were completed by the mesa isolation of the devices. A NiCr layer was evaporated to form the thin-film resistors. The Au-electroplating process was used for the device interconnection and the spiral inductor. By using this fabrication methods, this present invention can be applied to the MMIC (Microwave Monolithic Integrated Circuit).

Figure 5:
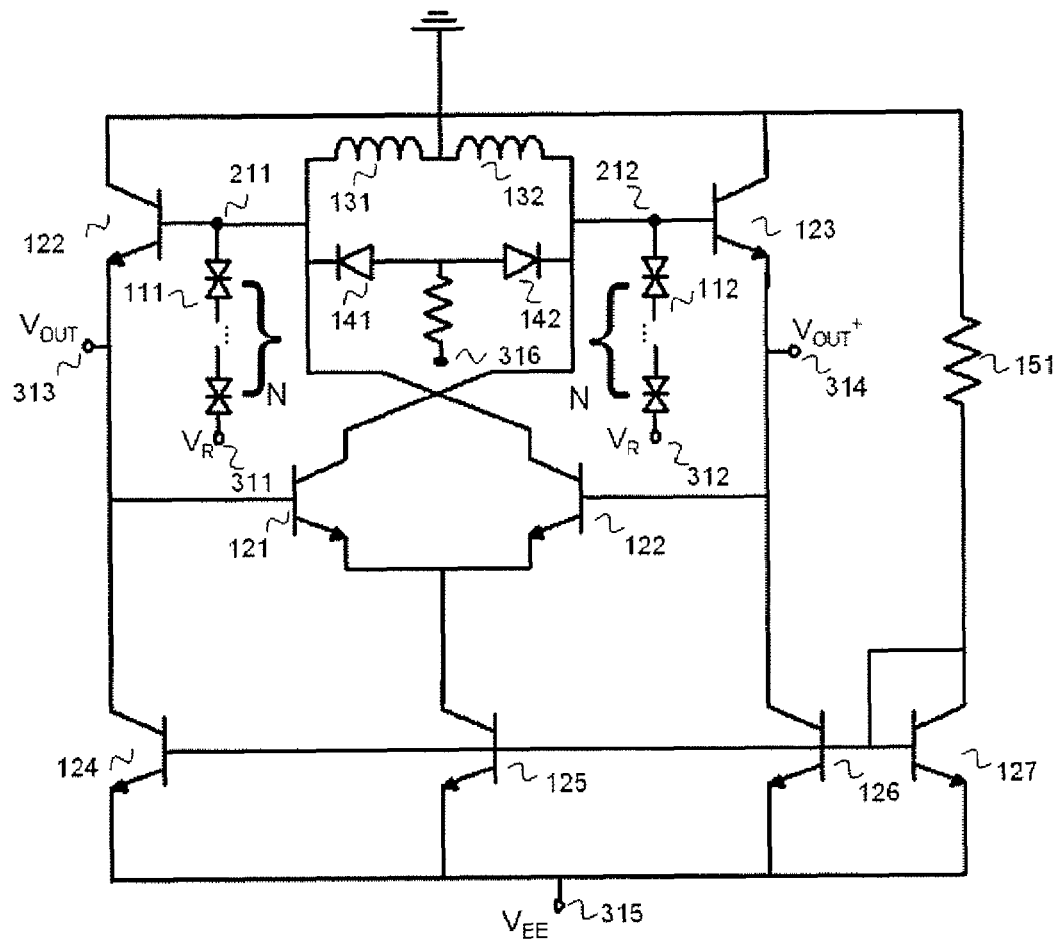
FIG. 5 is a schematic diagram of a preferred embodiment of a HBT/RTD differential oscillator circuit in accordance with the present invention.

FIG. 5 shows the schematic diagram of another preferred embodiment of a RTD/HBT oscillator circuit in accordance with the present invention. In this topology, at the node 211, 212, the N RTD are used. By increasing the number of the RTD which is connected at the node 211, 212, the magnitude of the negative conductance can be increased. Hence, more RF power can be obtained by increasing the number of the RTD which is connected at the node 211 and 212.

Figure 6:
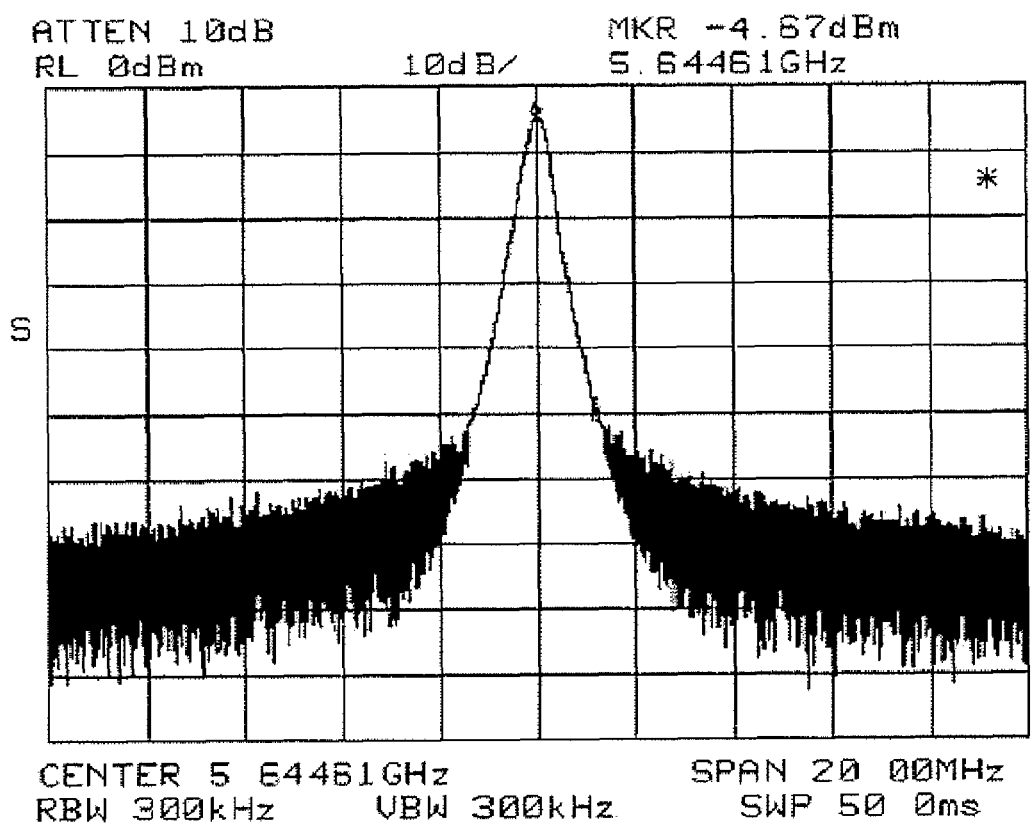
FIG. 6 is a graph of the output spectrum generated by the RTD/HBT differential oscillator circuit which is developed by the present invention.
Figure 7:
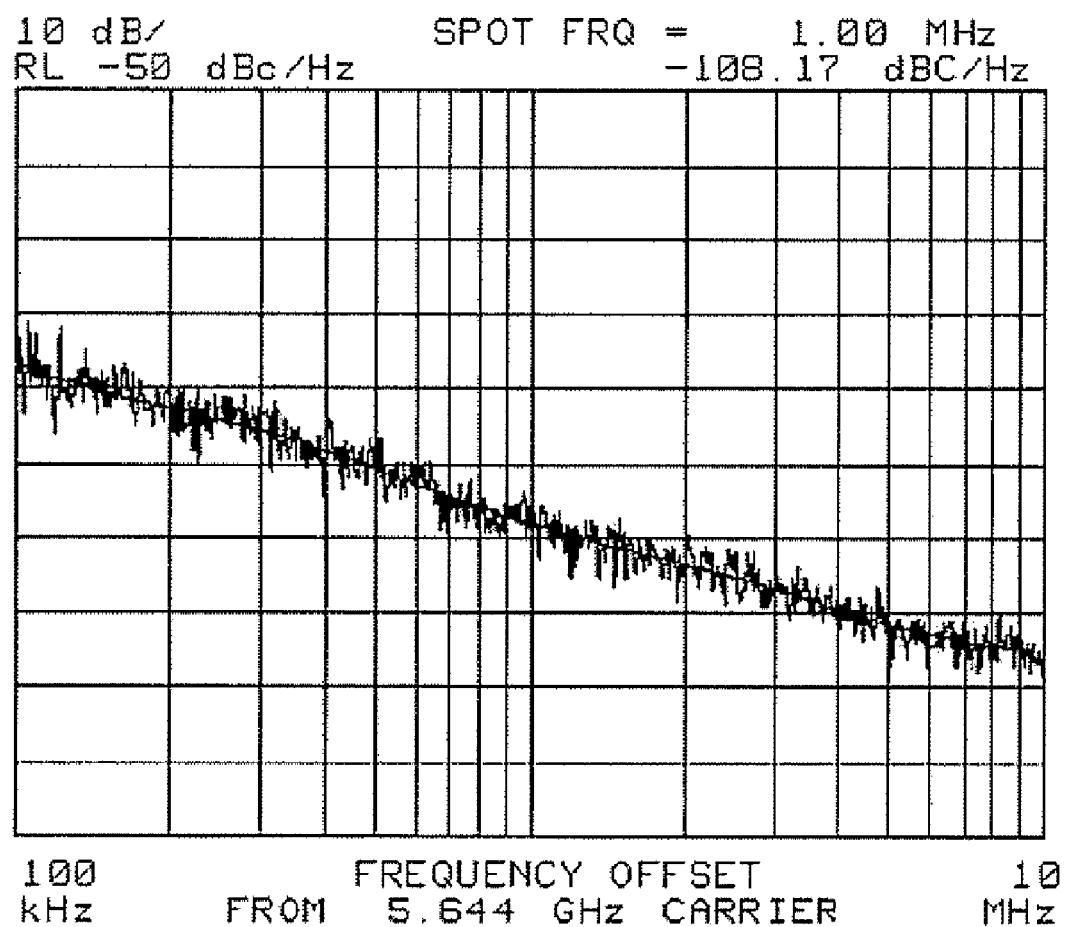
FIG. 7 is a graph of the phase noise results of the RTD/HBT differential oscillator circuit which is developed by the present invention.
Figure 8:
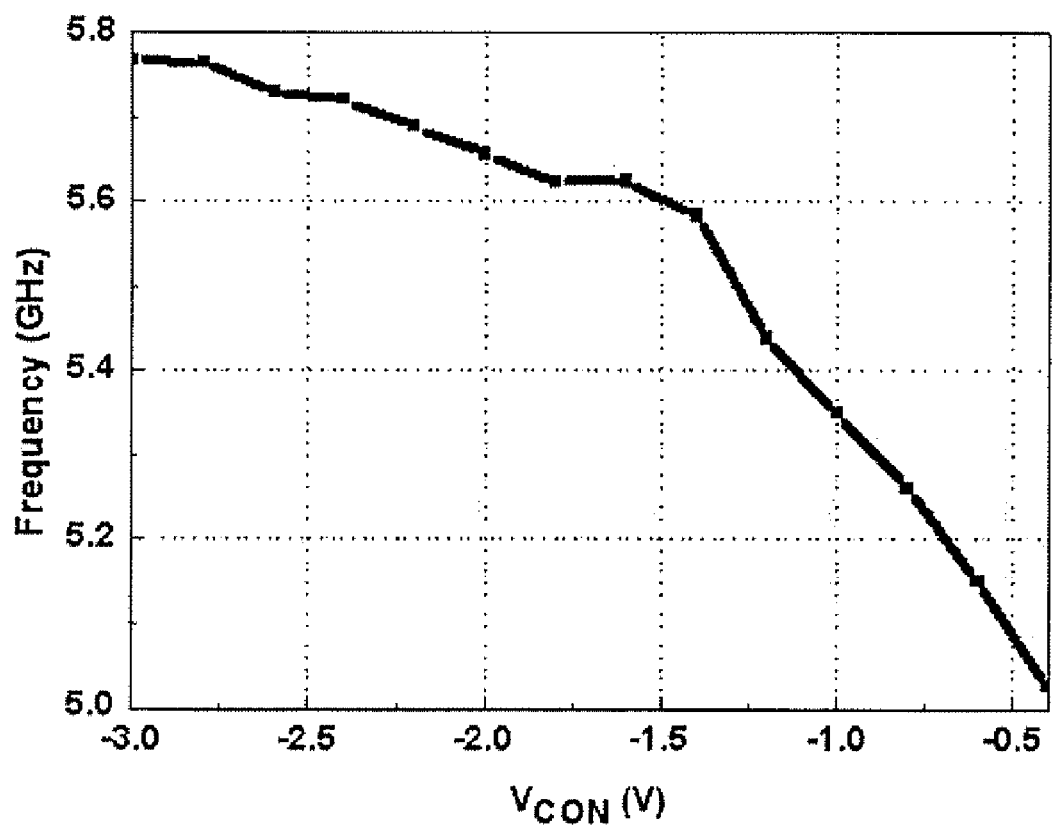
FIG. 8 is a graph of the oscillation frequency and the RF power on the varactor control voltage of the RTD/HBT differential oscillator circuit which is developed by the present invention.

The MMIC oscillator circuit by using present invention is manufactured and characterized. The 2×2 μm² RTD and 0.5×4.6 μm² HBT are used. The output spectrum and phase noise of the VCOs at the oscillation frequency are shown in FIG. 6 and FIG. 7, respectively. The output power of the VCO is −4.17 dBm. The obtained RF output power is more than the previous reported 2×2 μm² RTD based VCO. The phase noise value of the VCO is 108.17 dBc/Hz. The increased RF power also improves the phase noise performance of the VCO. From these measurement results, the present invention is found to be an effective approach for the enhancement of power performance based on the conventional RTD based VCOs. FIG. 8 shows the oscillation frequency on the control voltage of the varactor. The obtained frequency range is sufficiently good for the Voltage Controlled Oscillator (VCO). The total DC powers of the VCOs are below 60 mW. The addition RTD only consumes the DC power consumption of 2 mW.

Figure 9:
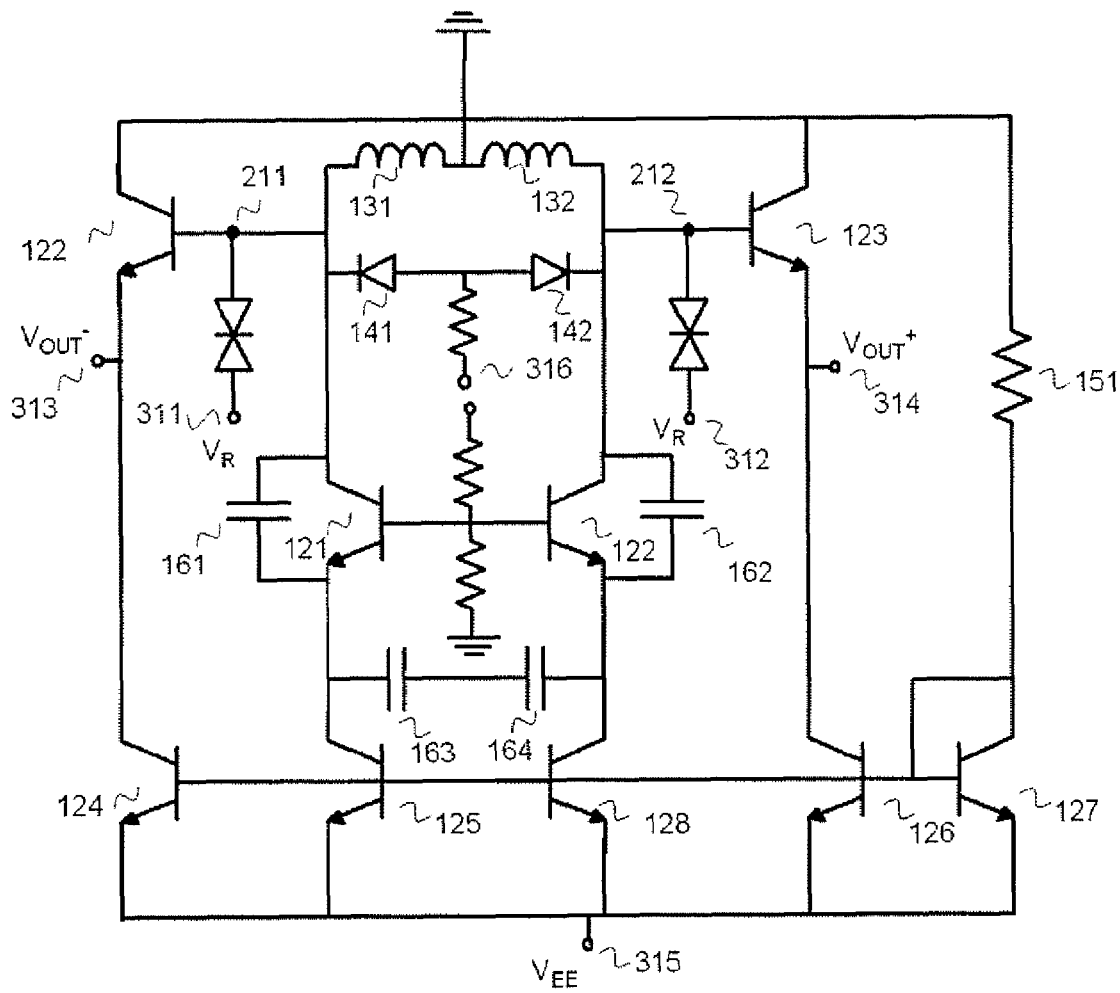
FIG. 9 is a schematic diagram of a preferred embodiment of a HBT/RTD differential oscillator circuit in accordance with the present invention.

FIG. 9 shows the schematic diagram of another preferred embodiment of a RTD/HBT oscillator circuit in accordance with the present invention. In this topology, the balanced oscillator topology is used instead of the cross-coupled oscillator topology. At the node, which generates the negative resistance, the RTDs are attached to increase the total negative conductance for increasing the RF power and reducing the phase noise. Also, in this balanced RTD/HBT oscillator, the N RTD can be used, and implemented by the MMIC.

Since those having ordinary knowledge and skill in the art of the present invention will recognize additional modifications and applications within the scope thereof, the present invention is not limited to the embodiments and drawings described above.

What is claimed is:

1. An oscillator circuit comprising:
a 3-terminal transistor based oscillator topology and a tunneling diode,
wherein the tunneling diode is connected at a node at which a negative conductance is generated in the 3-terminal transistor based oscillator topology, the 3-terminal transistor based oscillator topology is a 3-terminal transistor based differential oscillator topology which includes two nodes at which a negative conductance is generated, one port of the tunneling diode is connected at a first node of the two nodes at which the negative conductance is generated, and another port of the tunneling diode is connected to a bias circuit which applies a bias voltage to the tunneling diode.

2. An oscillator circuit according to claim 1, wherein the 3-terminal transistor based differential oscillator topology is a cross coupled oscillator topology in which two 3-terminal devices are cross-coupled connected, such that a collector or drain of a first 3-terminal device is connected to a base or gate of a second 3-terminal device, and a base or gate of the first 3-terminal device is connected to a collector or drain of the second 3-terminal device.

3. An oscillator circuit according to claim 1, wherein the 3-terminal transistor based differential oscillator topology is a balanced oscillator topology, in which two single-mode oscillator topologies, each comprising a 3-terminal device, are connected by a resonator.

4. An oscillator circuit according to claim 1, further comprising at least one other tunneling diode which is connected at a node at which a negative conductance is generated in the 3-terminal transistor based oscillator topology.

5. An oscillator circuit according to claim 1, wherein the tunneling diode is a resonant tunneling diode that reduces DC power consumption.

6. An oscillator circuit according to claim 1, wherein the 3-terminal transistor based oscillator topology comprises a Heterojunction Bipolar Junction Transistor (HBT) which is utilized in a microwave or mm-wave operation.

7. An oscillator circuit according to claim 1, wherein the 3-terminal transistor based oscillator topology and the tunneling diode are monolithically integrated with at least one passive device at an RTD/HBT epitaxial layer to form a Monolithic Microwave Integrated Circuit.

8. An oscillator circuit according to claim 1, wherein one port of a second tunneling diode is connected at a second node of the two nodes at which the negative conductance is generated, and another port of the second tunneling diode is connected to a bias circuit which applies a bias voltage to the second tunneling diode.

* * * * *